United States Patent
Jiang et al.

(10) Patent No.: US 11,687,693 B2
(45) Date of Patent: Jun. 27, 2023

(54) METHOD FOR EVALUATING FRACTURE CONNECTIVITY AND OPTIMIZING FRACTURE PARAMETERS BASED ON COMPLEX NETWORK THEORY

(71) Applicant: Southwest Petroleum University, Chengdu (CN)

(72) Inventors: Youshi Jiang, Chengdu (CN); Lirui Zhong, Chengdu (CN); Yan Kou, Chengdu (CN); Yongming Li, Chengdu (CN); Xiyu Chen, Chengdu (CN); Jingkai Hu, Chengdu (CN)

(73) Assignee: Southwest Petroleum University, Chengdu (CN)

( * ) Notice: Subject to any disclaimer, the term of this patent is extended or adjusted under 35 U.S.C. 154(b) by 0 days.

(21) Appl. No.: 17/994,099

(22) Filed: Nov. 25, 2022

(65) Prior Publication Data
US 2023/0169244 A1 Jun. 1, 2023

(30) Foreign Application Priority Data
Nov. 30, 2021 (CN) .......................... 202111442768.0

(51) Int. Cl.
*G06F 30/28* (2020.01)
(52) U.S. Cl.
CPC .................................... *G06F 30/28* (2020.01)
(58) Field of Classification Search
CPC ...................................................... G06F 30/28
See application file for complete search history.

(56) References Cited

U.S. PATENT DOCUMENTS

2018/0216442 A1* 8/2018 Shetty ..................... E21B 49/00

FOREIGN PATENT DOCUMENTS

| CN | 106988739 A | 7/2017 |
| CN | 110219630 A | 9/2019 |

(Continued)

OTHER PUBLICATIONS

Ghaffari, H. O., M. H. B. Nasseri, and R. P. Young. "Fluid flow complexity in fracture networks: Analysis with graph theory and LBM." arXiv preprint arXiv:1107.4918 (2011) (Year: 2011).*

(Continued)

*Primary Examiner* — Steven W Crabb
(74) *Attorney, Agent, or Firm* — Nitin Kaushik

(57) ABSTRACT

The present invention discloses a method for evaluating fracture connectivity and optimizing fracture parameters based on complex network theory, comprising the following steps: obtaining natural fracture distribution laws and characteristic parameters of the formation based on previous knowledge of natural fractures in the formation and statistical analysis of fractures in the core, and establishing a discrete fracture network model of natural fractures based on the previous step; setting up hydraulic fractures, determining intersection relations in the fracture network and coordinates of intersection points of fractures: converting the actual fracture network into a complex network dual topology diagram based on complex network theory, and calculating evaluative indexes of the complex network to realize the evaluation of fracture network connectivity; changing the hydraulic fracture parameters to get the evaluation indexes of different hydraulic fracture schemes.

9 Claims, 13 Drawing Sheets

(56) References Cited

FOREIGN PATENT DOCUMENTS

CN 111779477 A 10/2020
CN 112539049 A 3/2021

OTHER PUBLICATIONS

Liming Zhang, et al., "A Fractal Discrete Fracture Network Model for History Matching of Naturally Fractured Reservoirs," Fractals, vol. 27, No. 1 (Year: 2019).*
Cheng, et al., "Modelling hydraulic fracturing in a complex-fracture-network reservoir with the DDM and graph theory," Journal of Natural Gas Science and Engineering 47 (Year: 2017).*
Ernesto Estrada et al., "Random Neighborhood Graphs as Models of Fracture Networks on Rocks: Structural and Dynamical Analysis," arXiv: 1607.06678v2 (Year: 2017).*

* cited by examiner

METHOD FOR EVALUATING FRACTURE CONNECTIVITY AND OPTIMIZING FRACTURE PARAMETERS BASED ON COMPLEX NETWORK THEORY

CROSS-REFERENCE TO RELATED APPLICATIONS

The application claims priority to Chinese patent application No. 202111442768.0, filed on Nov. 30, 2021, the entire contents of which are incorporated herein by reference.

TECHNICAL FIELD

The present invention relates to a method for evaluating fracture connectivity and optimizing fracture parameters based on complex network theory, and belongs to the field of oil and gas reservoir development technology.

BACKGROUND

Fracture is the main channel for oil and gas migration in fractured formations, and good fracture connectivity is to favorable guarantee for high production of oil and gas wells. For fractured reservoirs, the impact of hydraulic fracturing on fracture network connectivity is also directly related to the stimulation effect.

Common fracture connectivity evaluation methods include well test analysis and numerical simulation. The well test analysis method is to determine the fracture connectivity in the reservoir by analyzing the changes of formation pressure and fluid properties between wells during the production process, but this method is time-consuming and costly; the numerical simulation, method is based on the fracture parameters obtained in the field to carry out seepage simulation to calculate the formation yield, so as to indirectly evaluate the fracture connectivity in the formation, but this method usually has the problems of complex models and high calculation costs.

There are a large number of complex systems in nature and human society, and by replacing the elements in the systems with nodes and the relationships of the elements with edges, complex network models of these systems can be established to realize the analysis and prediction of related problems within the systems, so the complex network theory has been widely applied in different fields such as finance, electricity, Internet and transportation. Fracture networks also have the characteristics of complex networks, so based on the complex network theory, the fractures and their connectivity relationships in fracture networks can be abstracted as complex networks consisting of fractures (nodes) and fracture intersections (edges between nodes), the connectivity between nodes of complex networks can be analyzed by evaluation indexes such as the average degree and the average clustering coefficient of complex networks, and the analysis and evaluation of the connectivity relationships of fracture networks can be determined accordingly. No research on the application of complex network theory for fracture network connectivity evaluation and hydraulic fracture parameter optimization has been seen yet, so this present has a relatively high potential for application.

SUMMARY

In order to overcome the problems in the prior art, the present invention provides a method for evaluating fracture connectivity and optimizing fracture parameters based on complex network theory; the method is easy to implement, simple to calculate and low in cost, and can quickly complete the preliminary evaluation of reservoir fracture connectivity, thus making up for the shortcomings of existing fracture connectivity evaluation methods.

The technical solution provided by the present invention to solve the above technical problems is: A method for evaluating fracture connectivity and optimizing fracture parameters based on complex network theory, comprising the steps:

Step 10: obtaining the distribution law of natural fractures in the formation and the actual characteristic parameters of natural fractures in the information based on previous knowledge of natural fractures in the formation and statistical analysis of fractures in the core;

Step 20: establishing a discrete fracture network model of natural fractures based on the distribution law of natural fractures in the formation and the characteristic parameters of natural fractures in the formation;

Step 30: setting the hydraulic fracture parameters and determining the coordinates of the intersection points of the fractures in the fracture network and the intersection relationship of the fractures according to the discrete fracture network model of natural fractures;

Step 40: converting the actual fracture network into a complex network dual topology diagram based on the complex network theory and the intersection relationship of the fractures in the fracture network;

Step 50: calculating the average degree, centrality, and average clustering coefficient of the complex network based on the converted complex network dual topology diagram, and calculating the comprehensive evaluation index based on the average degree, centrality, and average clustering coefficient;

Step 60: setting the hydraulic fracture parameters of the plurality of hydraulic fracture schemes and repeating Step 30 to Step 50 to obtain the comprehensive evaluation index of the plurality of hydraulic fracture schemes;

Step 70: determining the optimal hydraulic fracture scheme based on the comprehensive evaluation index of the plurality of hydraulic fracture schemes.

A further technical solution is that the natural fracture characteristic parameters of the formation described in Step 10 include the fracture length parameter and the fracture strike parameter.

A further technical solution is that the specific process of establishing a discrete fracture network model of natural fractures described in Step 20 is:

Step 201: randomly generating fracture data of the discrete fracture network model of natural fractures based on the distribution law of natural fractures in the formation;

Step 202: determining the coordinates of the center point of the generated fractures based on the fractal discrete fracture network theory, and establishing the corresponding linear equations of the fractures with the coordinates of the center point of the fractures and the fracture data to calculate the coordinates of the end points of the generated fractures, and to obtain the range of values of the coordinates of each fracture;

Step 203: assigning fracture properties to the fracture center points and establishing a discrete fracture network model of natural fractures.

A further technical solution is that the specific process described in Step 30 is:

Step 301: setting hydraulic fracture parameters, and then numbering the hydraulic fracture parameters and recording hydraulic fracture endpoint coordinates of such parameters;

Step 302: establishing the linear equation of each fracture based on the endpoint coordinates of the generated fractures in Step 202 and the endpoint coordinates of hydraulic fractures in Step 301, and solving for the intersection coordinates of the intersecting fractures;

Step 303: judging the fracture intersection relationship based on the intersection coordinates of the intersecting fractures obtained in Step 302 and combined with the respective coordinate ranges of the corresponding fractures;

Step 304: repeating Step 302 to Step 303 until the judgment of he intersection relationship of fractures in the entire fracture network is completed and recorded.

The method for evaluating fracture connectivity and optimizing fracture parameters based on complex network theory according to claim 4, wherein the specific process of Step 40 is:

Step 401: converting each fracture in the discrete fracture network model of natural fractures into a node under the complex network theory, and numbering and recording the node;

Step 402: connecting the nodes corresponding to the intersecting fractures with an edge according to the fracture intersection relationship, and numbering and recording the edge;

Step 403: repeating Step 402 until the conversion of all fractures and their intersection relations in the fracture network is completed.

A further technical solution is that the average degree is calculated by the following equation:

$$K_p = \frac{1}{M}\sum_{i=1}^{M} K_i$$

Where, $K_p$ is the average degree; M is the total number of nodes, in the fracture network; $K_i$ is the node degree of node i in any complex network.

A further technical solution is that the centrality is calculated by the following equation:

$$d_i = \frac{K_i}{M-1}$$

Where, $d_i$ is the centrality; M is the total number of nodes in the fracture network; $K_i$ is the nodal degree of node i in any complex network.

A further technical solution is that the average clustering coefficient is calculated by the following equation;

$$C = \frac{1}{M}\sum_{i=1}^{M} C_i$$

$$C_i = \frac{E_i}{K_i(K_i-1)/2}$$

Where, C is the average clustering coefficient; $C_i$ is the clustering coefficient of node i; M is the total number of nodes in the fracture network; $E_i$ is the actual number of edges of neighboring nodes of node i connected to each other.

A further technical solution is that the comprehensive evaluation index is calculated as follows:

First, the average degree, centrality, and average clustering coefficient are respectively nondimensionalized, and the specific nondimensionalized calculation formula is as follows:

$$L_i = \frac{l_i}{\max(l_i)}$$

Where, $L_i$ is the dimensionless value of a certain fracture connectivity evaluation index for any hydraulic fracture scheme i; $l_i$ is a certain fracture connectivity evaluation index for any hydraulic fracture scheme i; $\max(l_i)$ is the maximum value of a certain fracture connectivity evaluation index among all alternative hydraulic fracture schemes.

Then the obtained dimensionless average degree, centrality and average clustering coefficient are calculated to obtain the comprehensive evaluation indexes, which are calculated by the following formula:

$$F_i = \frac{1}{3}L_{Ki} + \frac{1}{3}L_{di} + \frac{1}{3}L_{Ci}$$

Where, $F_i$ is the comprehensive evaluation index of any hydraulic fracture scheme i, and the larger its value represents the better connectivity of the fracture under that scheme; $L_{Ki}$ is the dimensionless value of the average degree under any hydraulic fracture scheme i; $L_{di}$ is the dimensionless value of centrality under any hydraulic fracture scheme, i; $L_{Ci}$ is the dimensionless value of average clustering coefficient under any hydraulic fracture scheme i.

A further technical solution is that the hydraulic fracture scheme wide the largest comprehensive evaluation index is determined as the optimal hydraulic fracture scheme in Step 70.

The present invention has the following beneficial effects: This invention can effectively evaluate the degree of connectivity of formation fracture network Lind optimize the hydraulic fracture parameters, which is a guideline for the formulation of stimulation schemes for oil and gas fields.

DETAILED DESCRIPTION OF THE EMBODIMENTS

Figure 1:
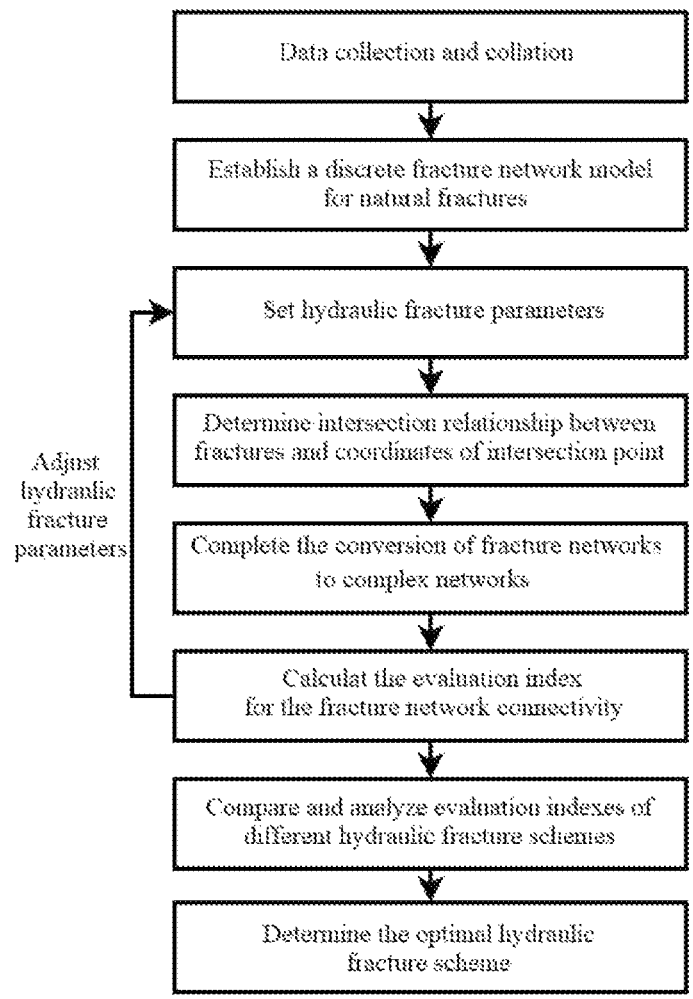
FIG. 1 is a schematic flow diagram of the method for evaluating fracture connectivity based on complex network theory provided in the present invention.

The technical solutions of the embodiments of the present invention will be described expressly and integrally in conjunction with the appended figures of the embodiments of the present invention. It is clear that the described embodiments are some but not all of the embodiments of the present invention. According to the embodiments of the present invention, all other embodiments obtained by those of ordinary skill in the art without creative effort fall within the protection scope of the present invention.

The method for evaluating fracture connectivity and optimizing fracture parameters based on complex network theory proposed by the present invention, comprising the following steps;

Step 1: obtaining the distribution law of natural fractures in the formation and the characteristic parameters of natural fractures, in the formation based on previous knowledge of natural, fractures in the formation and statistical analysis of fractures in the core, and establishing a discrete fracture network model of natural fractures based on the previous step, specifically comprising the following sub-steps Step 101: collecting the characteristic parameters of natural fractures in the field formation, mainly including parameters such as fracture length and fracture strike;

where the morphological characteristic parameters of large fractures and faults are determined by seismic data; the morphological characteristic parameters of small fractures are obtained by means of cores and outcrop observation, logging interpretation, etc., and the characteristic parameters and distribution laws of fractures are obtained by statistical methods;

Step 102: selecting a suitable distribution (including but not limited to Fisher distribution, normal distribution, power law distribution, uniform distribution) using the distribution law of natural fractures in the formation, and randomly generating fracture data such as fracture length, strike, density, etc. of the natural fracture discrete fracture network model based on the selected distribution;

Step 103: determining the coordinates of the center point of the generated fractures based on the fractal discrete fracture network theory, and establishing the corresponding linear equations of the fractures with the coordinates of the center point and the fracture data obtained in Step 102 to calculate the coordinates of the endpoints of the generated fractures, so as to obtain and record the range of values of the coordinates of each fracture;

Step 104: assigning fracture properties to the fracture center point obtained in Step 103 according to the obtained fracture distribution, and establishing a discrete fracture network model of natural fractures;

Step 2: setting up hydraulic fractures, constructing a comprehensive fracture network model containing natural fractures and hydraulic fractures, and calculating and determining the intersection relationship between the fractures and the coordinates of the intersection points, specifically including the following sub-steps:

Step 201: setting I hydraulic fracture in the discrete fracture network model of natural fractures obtained from Step 1, numbering the fracture and recording the hydraulic fracture endpoint coordinates;

Step 202: establishing the linear equation of each fracture based on the coordinates of the recorded fracture endpoints in Step 103 and the coordinates of the hydraulic fracture endpoints in Step 201, solving for the coordinates of the intersection points of the intersecting fractures, and specifically the equations established are equations (1) to (4):

(1) If fracture 1 and fracture 2 have the same endpoint, the endpoint is the intersection point of fracture 1 and fracture 2;

(2) IF fracture 1 and fracture 2 do not have the same endpoint, let O ($x_0$, $y_0$) he the coordinates of the intersection point of fracture 1 (with endpoint coordinates: A ($x_{i1}$, $y_{i1}$), B($x_{i2}$, $y_{y2}$)), and fracture 2 (with endpoint coordinates: C ($x_{j1}$, $y_{j1}$), (D$x_{j2}$, $y_{j2}$), O, A, and B arc each co-linear with O, C, and D to obtain the system of equations (1) and (2):

$$\frac{(y_0 - y_{i1})}{(x_0 - x_{i1})} = \frac{(y_0 - y_{i2})}{(x_0 - x_{i2})} \quad (1)$$

$$\frac{(y_0 - y_{j1})}{(x_0 - x_{j1})} = \frac{(y_0 - y_{j2})}{(x_0 - x_{j2})} \quad (2)$$

(2) The equations (1) and (2) are solved simultaneously to obtain the equations (3) and (4) for coordinates of the intersection point:

$$x_0 = \frac{(x_{j1} - x_{j2}) \times (x_{i2} y_{i1} - x_{i1} y_{i2}) - (x_{i1} - x_{i2}) \times (x_{j2} y_{j1} - x_{j1} y_{j2})}{(x_{j1} - x_{j2}) \times (y_{i1} - y_{i2}) - (x_{i1} - x_{i2}) \times (y_{j1} - y_{j2})} \quad (3)$$

$$y_0 = \frac{(y_{j1} - y_{j2}) \times (y_{i2} x_{i1} - y_{i1} x_{i2}) - (y_{i1} - y_{i2}) \times (y_{j2} x_{j1} - y_{j1} x_{j2})}{(y_{j1} - y_{j2}) \times (x_{i1} - x_{i2}) - (y_{i1} - y_{i2}) \times (x_{j1} - x_{j2})} \quad (4)$$

If the equations (3) and (4) have no solution, fracture 1 and fracture 2 have no intersection point;

Step 203: determining the intersection relationship of the fractures based on the obtained coordinates of the intersection points of the fractures combined with the respective coordinate ranges of the corresponding fractures, specifically including the following steps:

Let the range of x values be ($a_x$, $b_x$) and the range of y values be ($a_y$, $b_y$) for the point on fracture 1, and the range of x values be ($c_x$, $d_x$) and the range of y values be ($c_y$, $d_y$) for the point on fracture 2, and take the intersection of the range of x values for the points on fracture 1 and fracture 2 to obtain the range of values of x coordinates of the intersection point ($e_x$, $f_x$):

$$e_x = \max\{a_x, c_x\}$$

$$f_x = \min\{b_x, d_x\} \quad (5)$$

Take the intersection of the range of y values for the points on fracture 1 and fracture 2 to obtain the range of values of y coordinates of the intersection point ($e_y$, $f_y$):

$$e_y = \max\{a_y, c_y\}$$

$$f_y = \min\{b_y, d_y\} \quad (6)$$

if the intersection point coordinates O ($x_0$, $y_0$) calculated in (2) satisfy $x_0 \in (e_x, f_x)$, $y_0 \in (e_y, f_y)$, the intersection point coordinates O are on fracture 1 and fracture 2, and fracture 1 and fracture 2 intersect, otherwise the fractures do not intersect.

Step 304: repeating Step 202 to Step 203 until the judgment of the intersection relationship of fractures in the entire fracture network is completed and recorded;

Step 3: converting the actual fracture network into a complex network dual topology diagram according to the complex network theory, calculating the average clustering coefficient, average degree, and centrality of the complex network, and calculating the comprehensive evaluation index, specifically including the following sub-steps:

Step 301: converting the actual fracture network into a complex network dyadic topology diagram according to the complex network theory, specifically including the following steps:

(1) Converting each fracture in the discrete fracture network model of natural fractures obtained in Step 104 to a node, and numbering and recording the node;

(2) Connecting the nodes corresponding to the intersecting fractures with an edge according to the fracture intersection relationship obtained in Step 203, and numbering and recording the edge;

(3) Converting the actual fracture network into a complex network dual topology diagram;

Step 302: based on the relationship between nodes and edges in the complex network dual topology diagram obtained in Step 301, calculating each index for evaluating the fracture connectivity in the study area by equations (7) to (10):

(1) Average degree

The average degree ($K_p$) represents the average of the degrees of all nodes in the complex network and can be expressed by equation (7):

$$K_p = \frac{1}{M}\sum_{i=1}^{M} K_i \quad (7)$$

Where, $K_p$ is the average degree, which reflects the overall connectivity of the fracture network, the larger its value the better the connectivity; M is the total number of nodes (fractures) in the fracture network; $K_i$ is the node degree of node i in any complex network, the node degree is the number of neighboring nodes of any node in the complex network, which can be obtained directly using the recorded data in Step 301; the nodes directly connected to a node are the neighboring nodes of the node;

(2) Centrality

The centrality refers to the ratio of the number of directly connected nodes of a node to the total number of nodes in the complex network, which to a certain extent reflects the importance of the node in the complex network, and is reflected in the present invention as the connectivity of a fracture, and the closer the value is to 1, the better the connectivity of the fracture, which can he expressed by equation (8):

$$d_i = \frac{K_i}{M-1} \quad (8)$$

Where, $d_i$ denotes the node centrality of node i.

(3) Average clustering coefficient

The average clustering coefficient is the average of the clustering coefficients of all nodes in the network, which indicates the aggregation of nodes in the network and reflects the size of the probability that two neighboring nodes of any node in the network are still neighboring nodes, which can be expressed by equation (9):

$$C = \frac{1}{M}\sum_{i=1}^{M} C_i \quad (9)$$

Where, C is the average clustering coefficient of the complex network, which takes values in the range [0,1], and the closer its value is to 1 indicates that the greater the probability that the fractures in this fracture network are connected to each other, the better the fracture network connectivity; $C_i$ is the clustering coefficient of node which reflects the probability that the neighboring nodes of node i are connected to each other, and is calculated as shown in equation (10);

$$C_i = \frac{E_i}{K_i(K_i-1)/2} \quad (10)$$

Where, $E_i$ is the actual number of edges of neighboring nodes of node i that are connected
to each other;

$$\frac{K_i(K_i-1)}{2}$$

is the maximum number of edges of neighboring nodes of node i that can be connected to each other;

Step 303: nondimensionalizing the average degree, centrality, and average clustering coefficient obtained from Step 302, which are calculated as shown in equation (11):

$$L_i = \frac{l_i}{\max(l_i)} \quad (11)$$

Where, $L_i$ is the dimensionless value of a certain fracture connectivity evaluation index in any hydraulic fracture scheme i; $l_i$ is a certain fracture connectivity evaluation index (average degree, centrality, average clustering coefficient) in any hydraulic fracture scheme i; $\max(l_i)$ is the maximum value of such fracture connectivity evaluation index among all alternative hydraulic fracture schemes.

Step 304: adding up the weights of the dimensionless average degree, centrality, and average clustering coefficient obtained from Step 303 to obtain the comprehensive evaluation index for evaluating the fracture connectivity under a certain hydraulic fracture scheme, which is calculated by the following equation:

$$F_i = \frac{1}{3}L_{Ki} + \frac{1}{3}L_{di} + \frac{1}{3}L_{Ci}$$

Where, $F_i$ is the comprehensive evaluation index of the fracture connectivity in any hydraulic fracture scheme i, and the larger its value represents the better connectivity of the fracture under that scheme; $L_{Ki}$, is the dimensionless value of the average degree under any hydraulic fracture scheme i; $L_{di}$ is the dimensionless value of centrality under any hydraulic fracture scheme i; $L_{Ci}$ is the dimensionless value of average clustering coefficient under any hydraulic fracture scheme i.

Step 4: setting different hydraulic fracture parameters (including but not limited to the length and location of the hydraulic fracture), repeating Step 2 to Step 3 to calculate and compare, the comprehensive evaluation indexes for different hydraulic fracture schemes;

Step 5: based on the comprehensive evaluation index of each hydraulic scheme, determining the hydraulic fracture scheme with the largest index as the optimal hydraulic fracture scheme.

Embodiment 1

Figure 2:
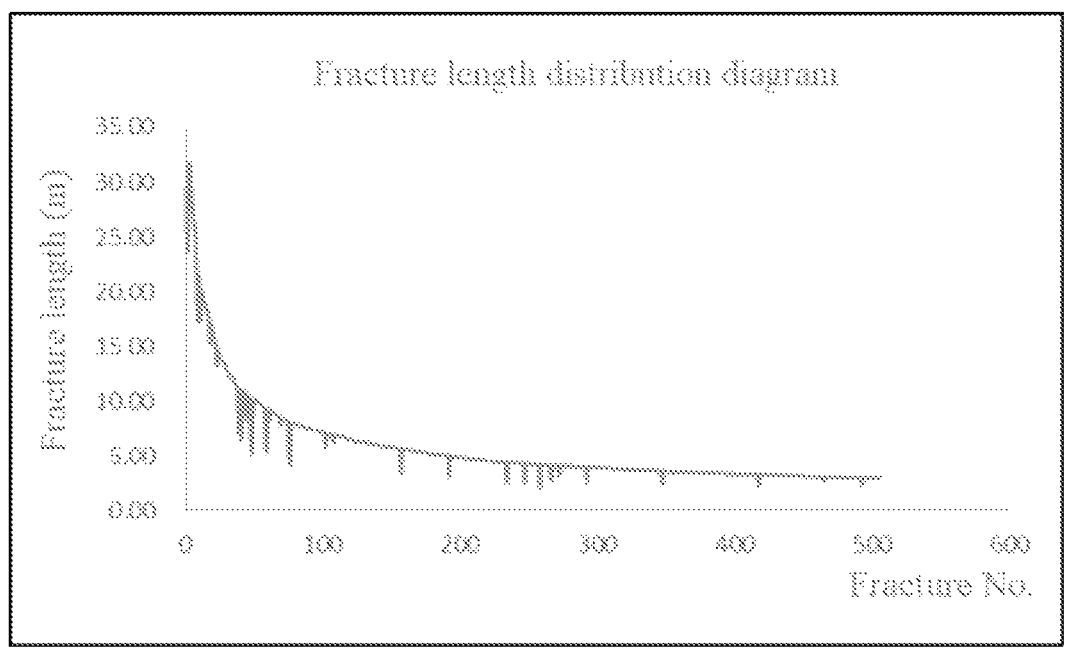
FIG. 2 is a distribution diagram of actual fracture length obtained from the collation in Embodiment 1.
Figure 3:
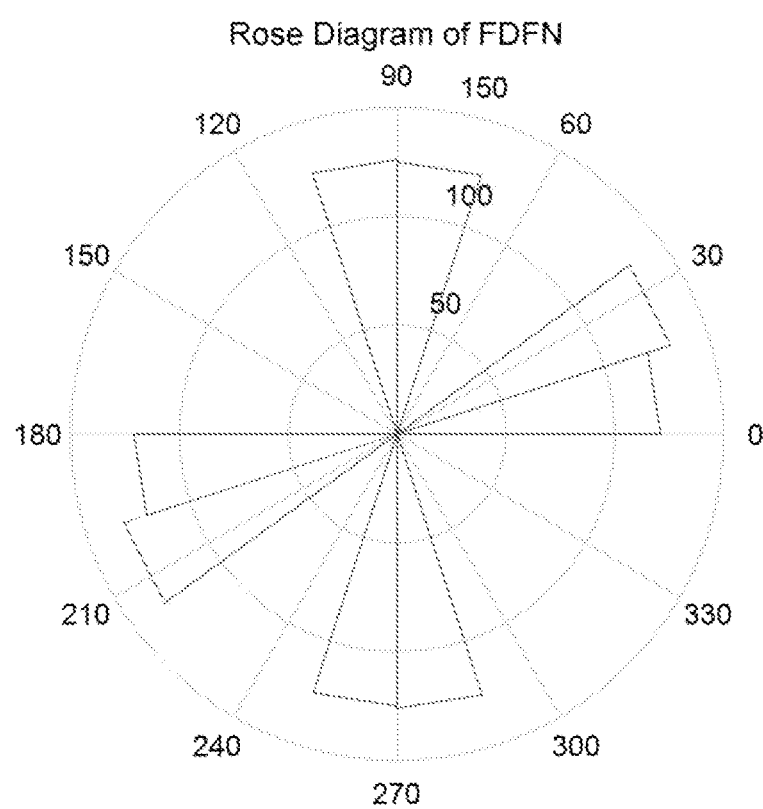
FIG. 3 is a rose diagram of the actual fracture strike obtained from the calculation in Embodiment 1.

A method for evaluating ground fracture connectivity based on complex network theory, comprising the following steps:

Step 1. obtaining the distribution law of natural fractures in the formation and the characteristic parameters of natural fractures in the formation based on previous knowledge of natural fractures in the formation and statistical analysis of fractures in the core, and establishing fractal natural discrete fracture network based on the previous step, specifically comprising the following sub-steps:

(1) Obtaining the distribution law of natural fractures in the formation and the characteristic parameters of natural fractures in the formation based on previous knowledge of natural fractures in the formation and statistical analysis of fractures in the core (where the fracture length is exponentially distributed as in FIG. 2 and the fracture strike rose diagram is shown in FIG. 3), randomly generating fracture data such as fracture length and fracture strike, and the results are shown in Table 1:

TABLE 1

Characteristic parameters of some generated fractures

| No. | fracture length (m) | fracture strike (degree) |
|---|---|---|
| 1 | 108.13 | 28.06 |
| 2 | 91.84 | −75.16 |
| 3 | 92.61 | 24.53 |
| 4 | 80.20 | −85.23 |
| 5 | 71.72 | 77.78 |
| 6 | 65.48 | 13.23 |
| 7 | 60.62 | 82.45 |
| 8 | 38.62 | −82.38 |
| 9 | 39.31 | 79.42 |
| 10 | 50.72 | 27.42 |
| ... | | |
| 11 | 41.60 | −84.33 |
| 12 | 46.30 | 17.75 |
| 13 | 39.18 | 24.83 |
| 14 | 42.86 | −84.45 |
| 15 | 41.41 | 21.14 |
| 16 | 40.09 | −79.83 |
| 17 | 38.90 | 19.01 |
| 18 | 37.80 | 8.03 |
| 19 | 36.80 | 25.81 |
| 20 | 35.87 | −79.96 |
| ... | | |

Notes: Due to the large amount of basic data of the fracture distribution characteristic parameters, only some of the data are listed in Table 1, where "..." indicates that there are data not listed;

(2) Determining the coordinates of the center point of the generated fractures based on the fractal discrete fracture network theory, establishing the corresponding linear equations of the fractures based on the coordinates of the center point and the randomly generated fracture data obtained in (1) to calculate the endpoints of the generated fractures and obtain the range of values of the fracture coordinates as shown in Table 2:

TABLE 2

Center point and endpoint coordinates of generated fractures

| fracture No. | Center point coordinate | Endpoint coordinate 1 | Endpoint coordinate 2 | Range of x-coordinates | Range of y-coordinates |
|---|---|---|---|---|---|
| 1 | (72.30, −39.20) | (120.0, −13.8) | (24.6, −64.6) | (24.6, 120.0) | (−64.6, −13.8) |
| 2 | (89.55, 75.60) | (77.8, 120.0) | (101.3, 31.2) | (77.8, 101.3) | (31.2, 120.0) |
| 3 | (72.10, −75.70) | (114.2, −56.5) | (30.0, −94.9) | (30.0, 114.2) | (−94.9, −56.5) |
| 4 | (114.30, 26.95) | (111.0, 66.9) | (117.6, −13.0) | (111.0, 117.6) | (−13.06, 66.9) |
| 5 | (23.20, 18.55) | (30.8, 53.6) | (15.6, −16.5) | (15.6, 30.8) | (−16.5, 53.6) |
| 6 | (74.65, −103.70) | (106.5, −96.2) | (42.8, −111.2) | (42.8, 106.5) | (−111.2, −96.2) |
| 7 | (94.5, −49.25) | (98.5, −19.2 ©©) | (90.5, −79.3) | (90.5, 98.5) | (−79.3, −19.2) |
| 8 | (−117.45, 72.30) | (−120.0, 91.4) | (−114.9, 53.2) | (−120.0, −114.9) | (53.2, 91.4) |
| 9 | (−39.20, −100.70) | (−35.6, −81.4) | (−42.8, −120.0) | (−42.8, −35.6) | (−120.0, −81.4) |
| 10 | (−29.40, 68.85) | (−6.9, 80.5) | (−51.9, 57.2) | (−51.9, −6.9) | (57.2, 80.5) |
| 11 | (99.45, −99.30) | (97.4, −78.6) | (101.5, −120.0) | (97.4, 101.5) | (−120.0, −78.6) |
| 12 | (28.05, −29.25) | (50.1, −22.2) | (6.0, −36.31) | (6.0, 50.1) | (−36.3, −22.2) |

TABLE 2-continued

Center point and endpoint coordinates of generated fractures

| fracture No. | Center point coordinate | Endpoint coordinate 1 | Endpoint coordinate 2 | Range of x-coordinates | Range of y-coordinates |
|---|---|---|---|---|---|
| 13 | (−102.20, −66.75) | (−84.4, −58.5) | (−120.0, −75.0) | (−120.0, −84.4) | (−75.0, −585) |
| 14 | (39.65, −25.75) | (37.6, −4.4) | (41.7, −47.1) | (37.6, 41.7) | (−47.1, −4.4) |
| 15 | (−59.80, −79.00) | (−40.5, −71.5) | (−79.1, −86.5) | (−79.1, −40.5) | (−86.5, −71.5) |
| 16 | (−68.25, 32.90) | (−71.8, 52.6) | (−64.7, 13.2) | (−71.8, −64.7) | (13.2, 52.6) |
| 17 | (3.85, −17.60) | (22.2, −11.3) | (−14.5, −23.9) | (−14.5, 22.2) | (−23.9, −11.3) |
| 18 | (97.70, −108.70) | (116.4, −106.1) | (79.0, −111.3) | (79.0, 116.4) | (−111.3, −106.1) |
| 19 | (−71.55, 76.40) | (−55.0, 84.4) | (−88.1, 684) | (−88.1, −55.0) | (68.4, 84.4) |
| 20 | (−32.95, 100.35) | (−36.1, 118.0) | (−29.8, 82.7) | (−36.1, −29.8) | (82.7, 118.0) |
| ... | | | | | |

Figure 4:
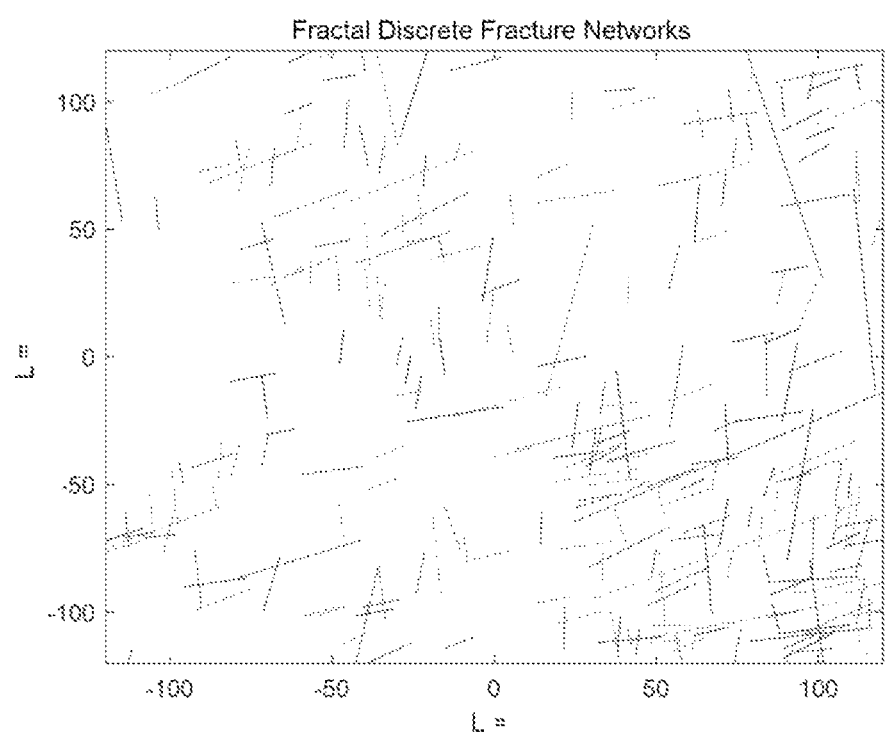
FIG. 4 is a result chart of the discrete: fracture network obtained from the calculation Embodiment 1.

(3) Assigning fracture properties to the fracture center point in (2) based on the fracture data obtained in (1), establishing a discrete fracture network model, and the results are shown in FIG. 4;

Step 2: setting up hydraulic fractures, and determining the intersection relationship between fractures and coordinates of intersection points in combination with natural fractures and hydraulic fractures calculation, specifically including the following sub-steps:

(1) Setting up a hydraulic fracture in the fracture network obtained from Step 1, numbering and recording the fracture, and the results are shown in Table 3:

TABLE 3

Setting of hydraulic fracture parameters for hydraulic fracture scheme 1

| Item | fracture No. | Fracture length (m) | Endpoint coordinate 1 | Endpoint coordinate 2 |
|---|---|---|---|---|
| Hydraulic fracture 1 | 259 | 120 | (40, 60) | (40, −60) |

(2) Establishing the linear equation of each fracture based on the fracture parameters of the fracture network obtained from Step 1 and the hydraulic fracture parameters in Table 3, solving for coordinates of the corresponding intersection points, and the results are shown in Table 4;

(3) Judging the fracture intersection relationship based on the respective coordinate ranges of the fractures in the fracture network obtained from Step 1 and the coordinates of the fracture intersection points obtained in (2), and the results are shown in Table 4;

TABLE 4

Intersection relationship of fractures in hydraulic fracture scheme 1

| intersected fracture No. | Coordinate of intersection point | Intersected or not |
|---|---|---|
| 1, 2 | (114.09, −16.9) | Not intersected |
| 1, 3 | (−402.28, −292.14) | Not intersected |
| 1, 4 | (117.78, −14.93) | Not intersected |
| 1, 5 | (2.65, −76.3) | Not intersected |
| 1, 6 | (−146.01, −155.54) | Not intersected |
| 1, 7 | (97.62, −25.68) | Intersected |
| 1, 8 | (−90.89, −126.16) | Not intersected |
| 1, 9 | (−38.83, −98.41) | Not intersected |
| 1, 10 | (11412.67, 6005.54) | Not intersected |
| ... | | |
| 1, 11 | (92.43, −28.45) | Not intersected |
| 1, 12 | (185.4, 21.11) | Not intersected |
| 1, 13 | (829.4, 364.38) | Not intersected |
| 1, 14 | (42, 52, −55.05) | Not intersected |
| 1, 15 | (149.44, 1.94) | Not intersected |
| 1, 16 | (−44.21, −101.28) | Not intersected |
| 1, 17 | (311.67, 88.41) | Not intersected |
| 1, 18 | (−114.24, −138.61) | Not intersected |
| 1, 19 | (3828.54, 1963) | Not intersected |
| ... | | |

Figure 5:
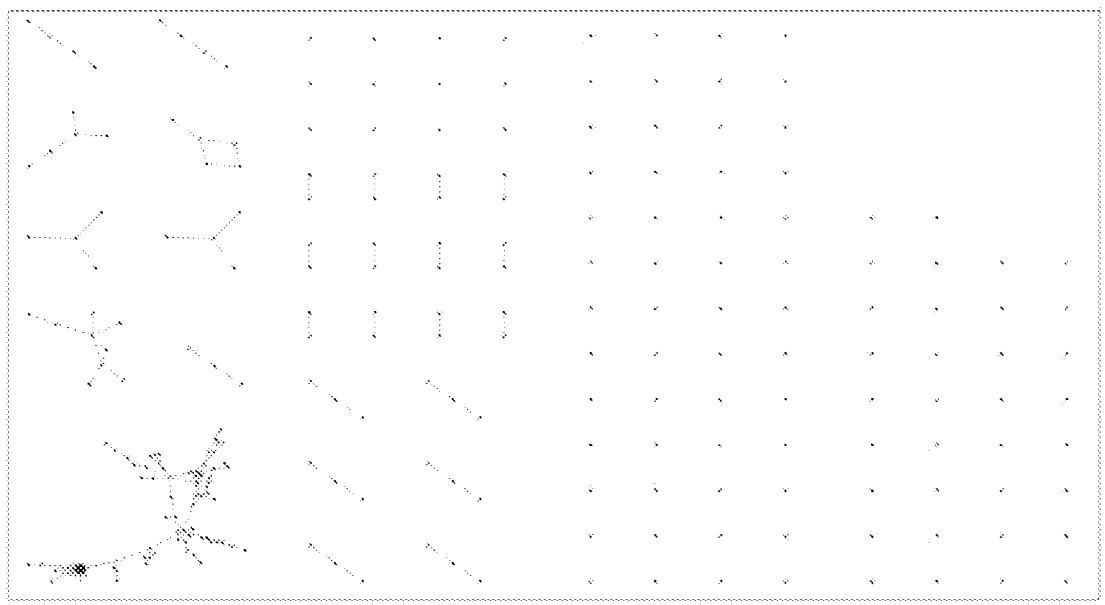
FIG. 5 is the complex network dual topology diagram of the hydraulic fracture scheme 1 obtained from the calculation in Embodiment 1.

Step 3: converting the actual fracture network into a complex network dual topology diagram according to the complex network theory, and calculating the evaluation indexes such as average clustering coefficient and average degree accordingly to realize the evaluation of fracture network connectivity, specifically including the following sub-steps:

(1) Converting the actual fracture network into a complex network dyadic topology diagram according to the complex network theory, specifically including the following steps:

1) Converting each fracture of the fracture network obtained in Step 1 and the hydraulic fractures set in Step 2 into nodes, and numbering and recording the nodes;

2) Connecting the nodes corresponding to the intersecting fractures with an edge according to the fracture intersection relationship obtained in Step 2, and numbering and recording the edge;

3) Repeating Step 2) to complete the conversion of all fractures and their intersection relationships in the fracture network (as in FIG. 5);

Notes: The largest solid circle in FIG. 5 represents hydraulic fractures; the remaining solid circles represent natural fractures in the formation; the connecting lines of solid circles represent fractures communicated with each other;

(2) Based on the relationship between nodes and edges in the dual topology diagram of the complex network, calculating each evaluation index of fracture network connectivity by equations (7) to (10):

1) The calculation results the evaluation indexes of the original complex network are shown in Table 5:

It can be found through the comparison of Table 5 and Table 6 that the average degree and the average clustering coefficient of the complex network increase to sonic extent under the condition of hydraulic fracture scheme 1, which indicates that the hydraulic fracture communicates a large number of natural fractures that are connected to each other,

TABLE 5

Calculation results of evaluation indexes of the original complex network (excluding hydraulic fractures)

| Node No. | Degree | Connected nodes No. | Node clustering coefficient | Node No. | Degree | Connected nodes No. | Node clustering coefficient |
|---|---|---|---|---|---|---|---|
| 1 | 3 | 7, 42, 123 | 0.33 | 11 | 12 | 6, 18, 32, 37 . . . | 0.12 |
| 2 | 2 | 50, 171 | 0.00 | 12 | 3 | 14, 74, 162 | 0.00 |
| 3 | 8 | 7, 24, 31, 35, 37 . . . | 0.00 | 13 | 5 | 55, 82, 121, 164 . . . | 0.10 |
| 4 | 0 | / | 0.00 | 14 | 8 | 12, 34, 54, 57 . . . | 0.00 |
| 5 | 2 | 17, 109 | 0.00 | 15 | 1 | 4 | 0.00 |
| 6 | 7 | 11, 38, 60, 156 . . . | 0.05 | 16 | 3 | 136, 143, 214 | 0.00 |
| 7 | 5 | 1, 3, 27, 176 . . . | 0.10 | 17 | 2 | 5, 28 | 0.00 |
| 8 | 0 | / | 0.00 | 18 | 6 | 11, 76, 128, 156 . . . | 0.13 |
| 9 | 3 | 179, 196, 258 | 0.00 | 19 | 3 | 73, 106, 149 | 0.00 |
| 10 | 2 | 158, 166 | 0.00 | 20 | 0 | / | 0.00 |
| . . . | | | | . . . | | | |

| Total number of fractures (excluding hydraulic fractures) | Average degree | Average clustering coefficient |
|---|---|---|
| 258 | 1.28 | 0.061 |

The fracture connectivity of the fracture network studied in this example is evaluated based on Table 5, the region has an area of 240 m×240 m and contains 258 natural fractures and the, average degree of the region is 1.28 indicating that the number of fractures directly communicating more than, two fractures is small and the degree of fractures communicating with each other in the region is low; the average clustering coefficient is 0.061, indicating that the probability of adjacent fractures of any fracture in the fracture network communicating with each other is 6.1%. The result value of the above evaluation index is low, so the fracture connectivity of this fracture network is poor.

Figure 6:
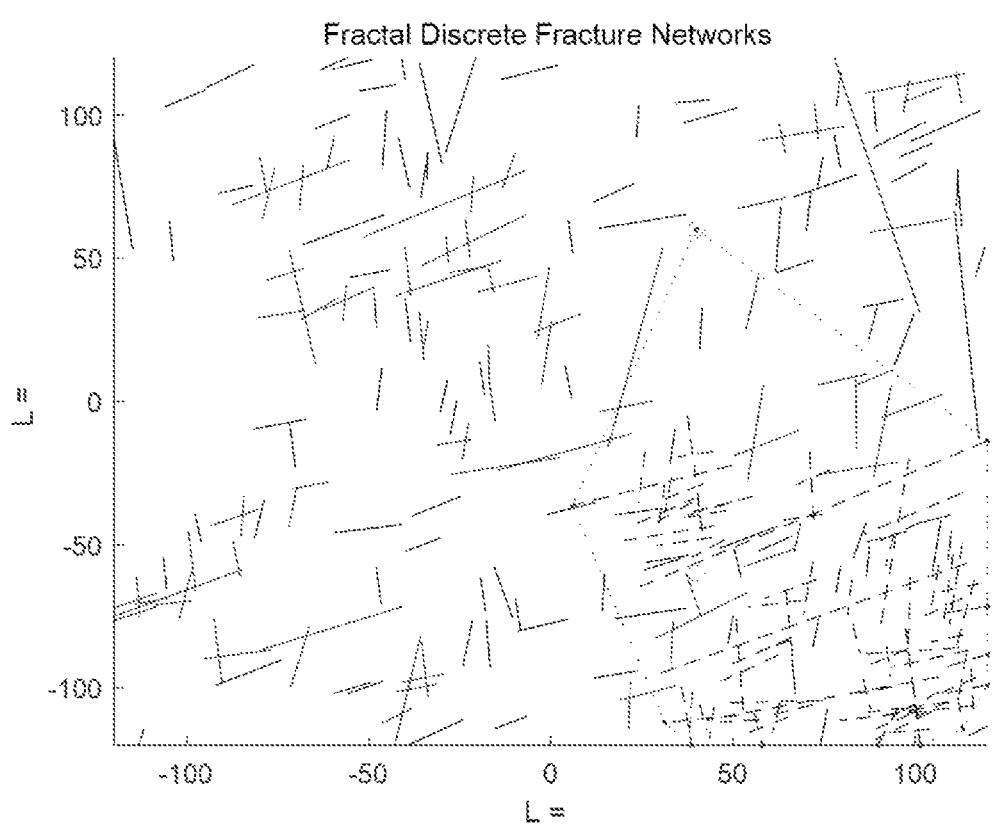
FIG. 6 is the communication of the hydraulic fracture scheme 1 (initial) with the natural fracture obtained from the calculation n Embodiment 1.
Figure 7:
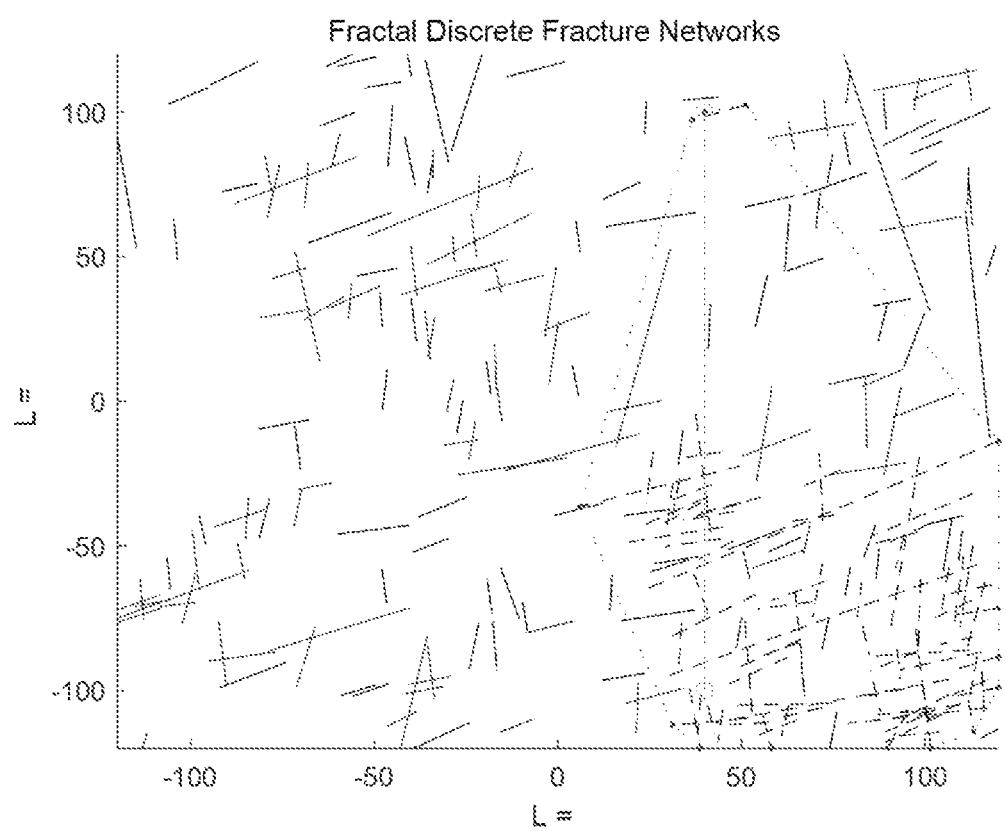
FIG. 7 is the communication of the hydraulic fracture scheme 2 (fracture length adjustment) with the natural fracture obtained from the calculation in Embodiment 1.
Figure 8:
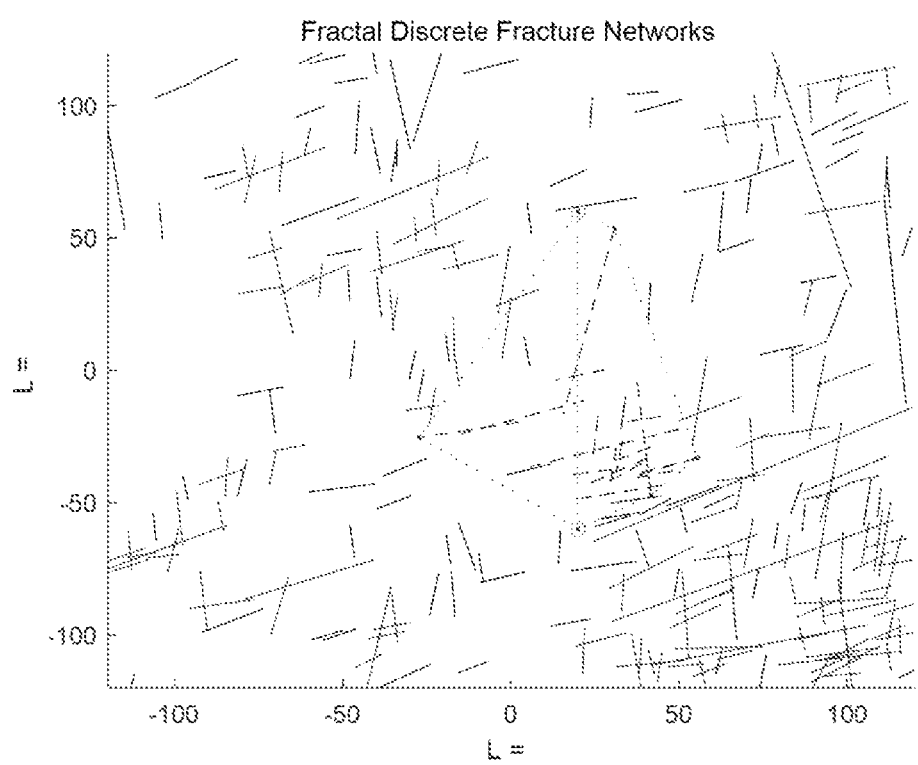
FIG. 8 is the communication of the hydraulic fracture scheme 3 (position adjustment) with the natural fracture obtained from the calculation in Embodiment 1.
Figure 9:
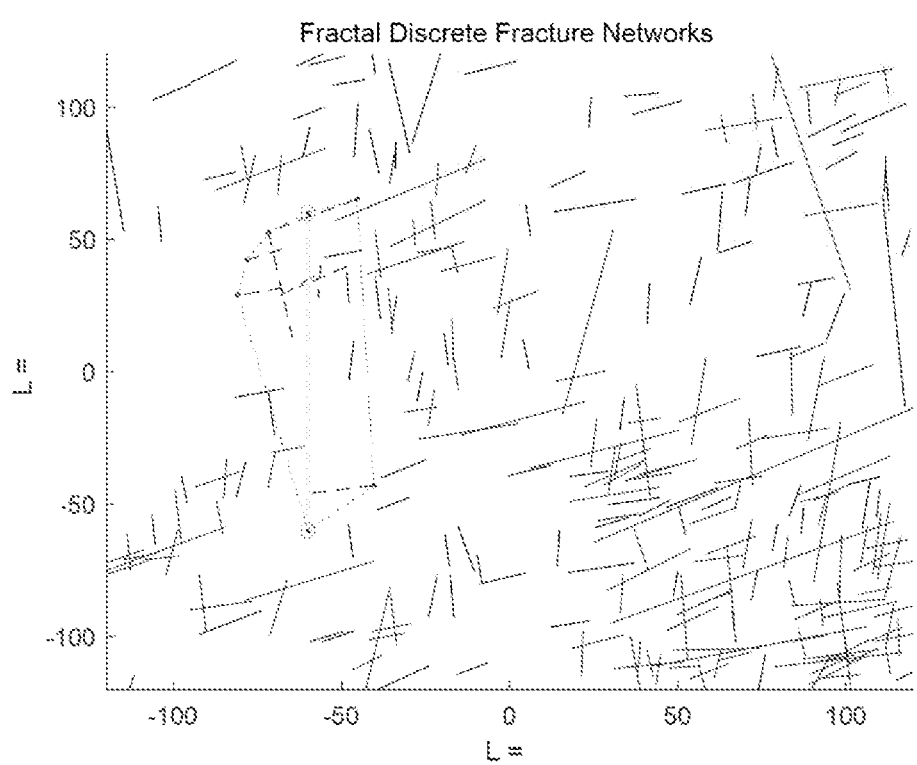
FIG. 9 is the communication of the hydraulic fracture scheme 4 (position adjustment) with the natural fracture obtained from the calculation in Embodiment 1.
Figure 10:
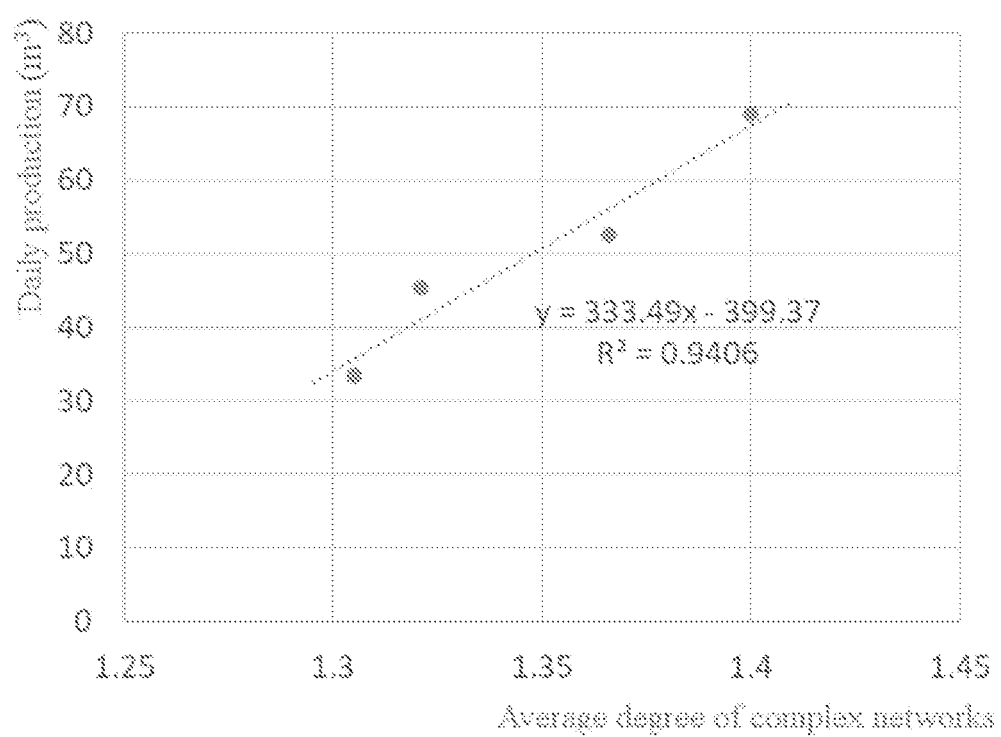
FIG. 10 is the analysis result chart of the correlation between the average degree and the yield of each hydraulic fracture scheme obtained from the calculation in Embodiment 1.
Figure 11:
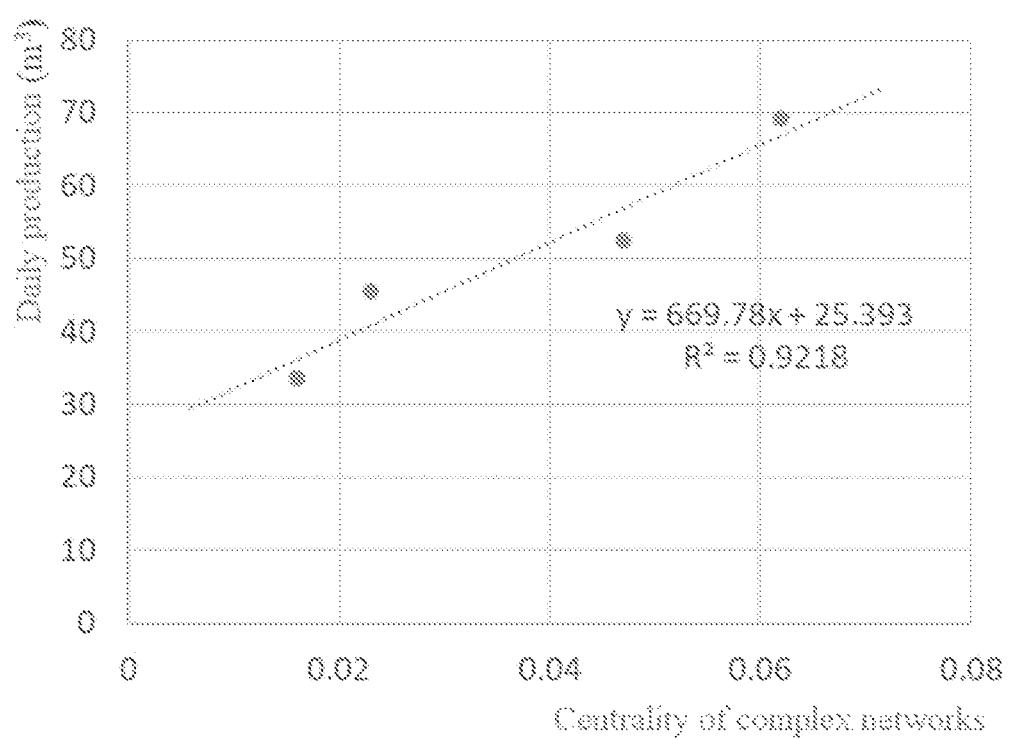
FIG. 11 is the analysis result chart of the correlation between the centrality and the yield of each hydraulic fracture scheme obtained from the calculation in Embodiment 1.
Figure 12:
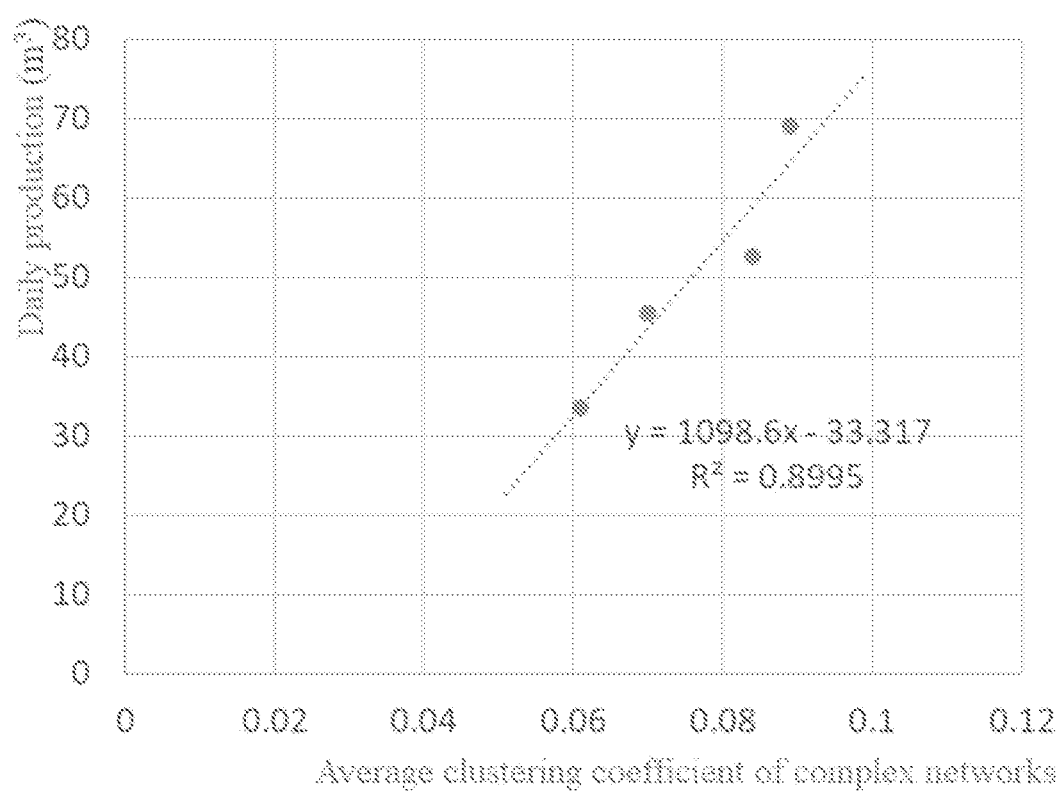
FIG. 12 is the analysis result chart of the correlation between the average clustering coefficient and the yield of each hydraulic fracture scheme obtained from the calculation in Embodiment 1.
Figure 13:
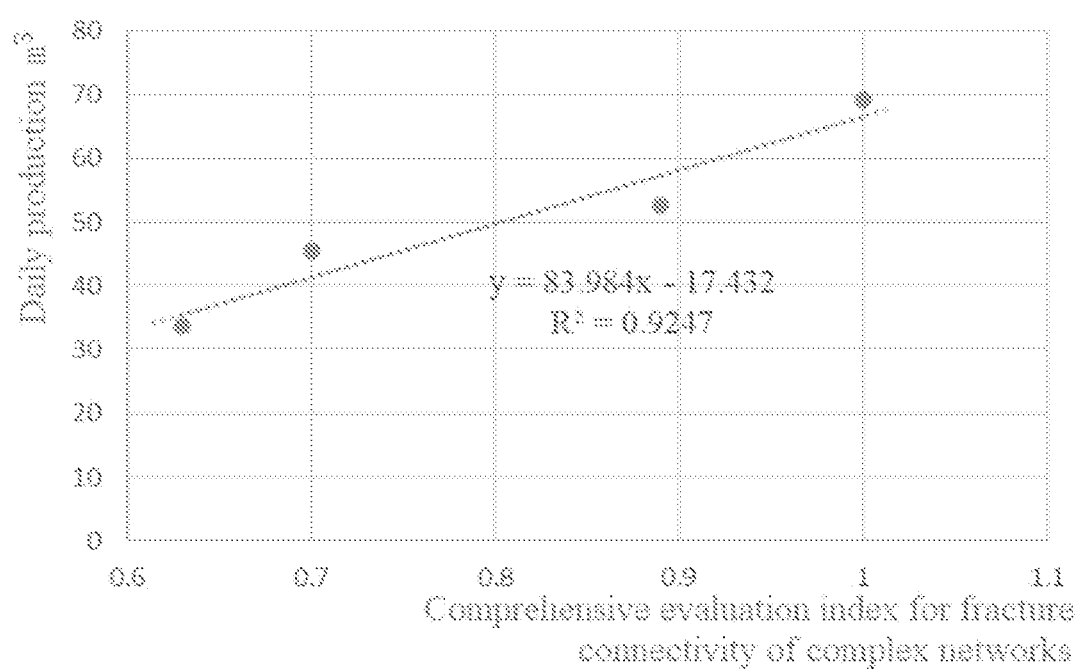
FIG. 13 is the analysis result chart of the correlation between the comprehensive evaluation index of fracture connectivity and the yield of each hydraulic fracture scheme obtained from the calculation in Embodiment 1.

(2) The equations (7) to (10) are used to calculate the complex network evaluation indexes of hydraulic fracture scheme 1 (as shown in Table 6). and to obtain the discrete fracture network result diagram under this hydraulic fracture scheme (as shown in FIG. 6).

and the fracture connectivity of the whole complex network has improved, but it is still at a low value; while the centrality value of the hydraulic fracture is closer to 1, which means its connectivity is stronger, but the result of this scheme is 0.047, so the connectivity of hydraulic fractures under this scheme is poor;

Step 4: Changing the hydraulic fracture parameters, repeating Step 2 to Step 3 to obtain the evaluation indexes of different hydraulic fracture schemes, comparing the evaluation results of different schemes to determine the optimal hydraulic fracture scheme, specifically including the following sub-steps:

(1) Changing the hydraulic fracture parameters (as shown in Table 7), repeating Step 2 to Step 3 to obtain the evaluation indexes of the complex network under each scheme (as shown in Table 8) and the corresponding discrete fracture network result diagram (as shown in FIG. 7 to FIG. 9).

TABLE 6

Calculation results of connectivity evaluation indexes for hydraulic fracture scheme 1

| Scheme | Total number of natural fractures in the fracture network (pcs) | No. of directly communicated natural fractures | Total number of natural fractures in the fracture network (pcs) | Average degree | Centrality | Average clustering coefficient |
|---|---|---|---|---|---|---|
| Hydraulic fracture scheme 1 | 258 | 1, 12, 14, 34, 54, 57, 104, 124, 185, 186, 205, 244 | 80 | 1.366 | 0.047 | 0.084 |

TABLE 7

Settings of hydraulic fracture parameters for different hydraulic fracture schemes

| Item | fracture No. | Fracture length (m) | Endpoint coordinate 2 | Endpoint coordinate 1 |
|---|---|---|---|---|
| Hydraulic fracture scheme 2 | 259 | 80 | (40, 100) | (40, −100) |
| Hydraulic fracture scheme 3 | | 120 | (20, 60) | (20, −60) |
| Hydraulic fracture scheme 4 | | | (−60, 60) | (−60, −60) |

TABLE 8

Calculation results of connectivity evaluation index for different hydraulic fracture schemes

| | | Location adjustment | |
|---|---|---|---|
| Item | Fracture length adjustment Hydraulic fracture scheme 2 | Hydraulic fracture scheme 3 | Hydraulic fracture scheme 4 |
| Total number of natural fractures (pcs) | 258 | | |
| Half fracture length (m) | 100 | 60 | 60 |
| No. of directly communicated natural fractures | 1, 3, 12, 14, 29, 34, 54, 57, 96, 104, 108, 124, 185, 186, 205, 244 | 5, 12, 17, 34, 109, 168 | 40, 65, 100, 143 |
| Total number of communicated natural fractures (pcs) | 84 | 18 | 8 |
| Average degree | 1.400 | 1.321 | 1.305 |
| Centrality | 0.062 | 0.023 | 0.016 |
| Average clustering coefficient | 0.089 | 0.070 | 0.061 |

Notes: The dotted lines in FIG. 6 to FIG. 9 represent hydraulic fractures, and ⊚ represents the endpoint of hydraulic fractures; the dashed lines represent the natural fracture fractures communicated by hydraulic fractures; the solid lines represent natural fractures; the area enclosed by the point type lines is the control area of hydraulic fractures.

(2) Based on the average degree, centrality, and average clustering coefficient obtained from the above schemes, the comprehensive evaluation indexes of fracture connectivity evaluation of each hydraulic scheme are calculated, and the results are shown in Table 9:

TABLE 9

Calculation results of connectivity comprehensive evaluation index for different hydraulic fracture schemes

| Item | Hydraulic fracture scheme 1 | Hydraulic fracture scheme 2 | Hydraulic fracture scheme 3 | Hydraulic fracture scheme 4 |
|---|---|---|---|---|
| Comprehensive evaluation index | 0.89 | 1.00 | 0.70 | 0.63 |

(3) The daily production of each hydraulic fracture scheme can be calculated by numerical simulation methods. The daily production of a single well at the 30$^{th}$ day of production under different hydraulic fracture schemes is calculated, and the results are shown in Table 9. The daily production data for different hydraulic fracture schemes can be used to determine the correlation between the complex network evaluation index and the daily production within a fractured reservoir.

TABLE 9

Single-well production for different hydraulic fractures

| | Single-well production (m$^3$) | | | |
|---|---|---|---|---|
| Item | Hydraulic fracture scheme 1 | Hydraulic fracture scheme 2 | Hydraulic fracture scheme 3 | Hydraulic fracture scheme 4 |
| At the 30$^{th}$ day of production | 52.54 | 69.13 | 45.46 | 33.57 |

The evaluation indicators in the present invention include the average degree, centrality, average clustering coefficient, and comprehensive evaluation indicators, all of which show a positive correlation with daily oil production (FIG. 10 to FIG. 13). The higher value of the evaluation index indicates a higher daily production, and also indicates a better connectivity of the fracture network and hydraulic fracture. It can be seen through the comparison of the evaluation indexes of connectivity under each hydraulic fracture scheme obtained in Table 6 and Table 8 that the hydraulic fracture scheme 2 has the largest evaluation index value, with the best connectivity and the highest daily oil production, so the well location and fracturing parameters can be determined according to the hydraulic fracture scheme 2.

The above are not intended to limit the present invention in any form, Although the present invention has been disclosed a above with preferred embodiments, it is not intended to limit the present invention, Those skilled in the art, within the scope of the technical solution of the present invention, can use the disclosed technical content to make a few changes or modify the equivalent embodiment with equivalent changes. Within the scope of the technical solution of the present invention, any simple modification, equivalent change and modification made to the above embodiments according to the technical essence of the present invention are still regarded as a part of the technical solution of the present invention.

The invention claimed is:

1. A method for evaluating fracture connectivity and optimizing fracture parameters based on complex network theory for high production of oil and gas wells, comprising the following steps:

Step 10: obtaining a distribution law of natural fractures in a formation and characteristic parameters of natural fractures in the formation based on previous knowledge of natural fractures in the formation and statistical analysis of fractures in a core;

Step 20: establishing a discrete fracture network model of natural fractures based on the distribution law of natural fractures in the formation and the characteristic parameters of natural fractures in the formation, wherein the specific process of establishing the discrete fracture network model of natural fractures is:

Step 201: randomly generating fracture data of the discrete fracture network model of natural fractures based on the distribution law of natural fractures in the formation;

Step 202: determining coordinates of a center point of the generated fracture data based on the fractal discrete fracture network theory, and establishing a corresponding linear equations of the fractures with the coordinates of the center point of the fractures and the fracture data to calculate coordinates of the end points of the generated fracture data, and to obtain a range of values of the coordinates of each fracture;

Step 203: assigning fracture properties to the fracture center points and establishing a discrete fracture network model of natural fractures;

Step 30: setting hydraulic fracture parameters and determining coordinates of intersection points of the fractures in the discrete fracture network model and an intersection relationship of the fractures according to the discrete fracture network model of natural fractures;

Step 40: converting the resulting discrete fracture network model into a complex network dual topology diagram based on the complex network theory and the intersection relationship of the fractures in the fracture network;

Step 50: calculating an average degree, centrality, and average clustering coefficient of a complex network based on the converted complex network dual topology diagram, and calculating a comprehensive evaluation index based on the average degree, centrality, and average clustering coefficient;

Step 60: setting the hydraulic fracture parameters of a plurality of hydraulic fracture schemes and repeating Step 30 to Step 50 to obtain the comprehensive evaluation index of each of the plurality of hydraulic fracture schemes;

Step 70: determining an optimal hydraulic fracture scheme based on the comprehensive evaluation index of the plurality of hydraulic fracture schemes.

2. The method of evaluating fracture connectivity and optimizing fracture parameters based on complex network theory according to claim 1, wherein the characteristic parameters of natural fractures in the formation described in Step 10 comprise a fracture length parameter and a fracture strike parameter.

3. The method for evaluating fracture connectivity and optimizing fracture parameters based on complex network theory according to claim 1, wherein the specific process of Step 30 is:

Step 301: setting hydraulic fracture parameters, and then numbering the hydraulic fracture parameters and recording hydraulic fracture endpoint coordinates of the hydraulic fracture parameters;

Step 302: establishing the linear equation of each fracture based on the endpoint coordinates of the generated fractures in Step 202 and the endpoint coordinates of hydraulic fractures in Step 301, and solving for the intersection coordinates of the intersecting fractures;

Step 303: judging fracture intersection relationship based on the intersection coordinates of the intersecting fractures obtained in Step 302 and combined with the respective coordinate ranges of the corresponding fractures;

Step 304: repeating Step 302 to Step 303 until the judgment of the intersection relationship of fractures in the entire fracture network is completed and recorded.

4. The method for evaluating fracture connectivity and optimizing fracture parameters based on complex network theory according to claim 3, wherein the specific process of Step 40 is:

Step 401: converting each fracture in the discrete fracture network model of natural fractures into a node under the complex network theory, and numbering and recording the node;

Step 402: connecting the nodes corresponding to the intersecting fractures with an edge according to the fracture intersection relationship, and numbering and recording the edge;

Step 403: repeating Step 402 until the conversion of all fractures and their intersection relations in the fracture network is completed.

5. The method for evaluating fracture connectivity and optimizing fracture parameters based on complex network theory according to claim 1, wherein the average degree is calculated by the following formula:

$$K_p = \frac{1}{M}\sum_{i=1}^{M} K_i$$

Where, $K_p$, is the average degree; M is the total number of nodes in the fracture network; $K_i$ is the node degree of node i in any complex network.

6. The method for evaluating fracture connectivity and optimizing fracture parameters based on complex network theory according to claim 1, wherein the centrality is calculated by the following formula:

$$d_i = \frac{K_i}{M-1}$$

Where, $d_i$ is the centrality; M is the total number of nodes in the fracture network; $K_i$ is the nodal degree of node i in any complex network.

7. The method for evaluating fracture connectivity and optimizing fracture parameters based on complex network theory according to claim 1, wherein the average clustering coefficient is calculated by the following formula:

$$C = \frac{1}{M}\sum_{i=1}^{M} C_i$$

$$C_i = \frac{E_i}{K_i(K_i-1)/2}$$

Where, C is the average clustering coefficient; $C_i$ is the clustering coefficient of node i; M is the total number of nodes in the fracture network; $E_i$ is the actual number of edges of neighboring nodes of node i connected to each other; $K_i$ is the node degree of node i in any complex network.

8. The method for evaluating fracture connectivity and optimizing fracture parameters based on complex network theory according to claim 1, wherein the process of calculating the comprehensive evaluation index is:

First, the average degree, centrality, and average clustering coefficient are respectively nondimensionalized, and the specific nondimensionalized calculation formula is as follows:

$$L_i = \frac{l_i}{\max(l_i)}$$

Where, $L_i$ is the dimensionless value of a certain fracture connectivity evaluation index for any hydraulic fracture scheme i; $l_i$ is a certain fracture connectivity evaluation index for any hydraulic fracture scheme i; $\max(l_i)$ is the maximum value of a certain fracture connectivity evaluation index among all alternative hydraulic fracture schemes;

Then the obtained dimensionless average degree, centrality and average clustering coefficient are calculated to obtain the comprehensive evaluation indexes, which are calculated by the following formula:

$$F_i = \frac{1}{3}L_{Ki} + \frac{1}{3}L_{di} + \frac{1}{3}L_{Ci}$$

Where, $F_i$ is the comprehensive evaluation index of any hydraulic fracture scheme i, and the larger its value represents the better connectivity of the fracture under that scheme; $L_{Ki}$ is the dimensionless value of the average degree under any hydraulic fracture scheme i; $L_{di}$ is the dimensionless value of centrality under any hydraulic fracture scheme i; $L_{Ci}$ is the dimensionless value of average clustering coefficient under any hydraulic fracture scheme i.

9. The method of evaluating fracture connectivity and optimizing fracture parameters based on complex network theory according to claim 8, wherein the hydraulic fracture scheme with the largest comprehensive evaluation index is determined as the optimal hydraulic fracture scheme in Step 70.

* * * * *